(12) United States Patent
Park et al.

(10) Patent No.: US 9,859,518 B2
(45) Date of Patent: Jan. 2, 2018

(54) ORGANIC LIGHT-EMITTING DEVICE

(71) Applicant: LG Display Co., Ltd., Seoul (KR)

(72) Inventors: EunJung Park, Goyang-si (KR);
Byungsoo Kim, Goyang-si (KR);
Hanbyeol Seok, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/178,985

(22) Filed: Jun. 10, 2016

(65) Prior Publication Data

US 2017/0062751 A1    Mar. 2, 2017

(30) Foreign Application Priority Data

Aug. 31, 2015    (KR) .................. 10-2015-0123252

(51) Int. Cl.
*H01L 51/50* (2006.01)
*H01L 51/52* (2006.01)
*H01L 27/32* (2006.01)

(52) U.S. Cl.
CPC ........ *H01L 51/504* (2013.01); *H01L 27/3211* (2013.01); *H01L 51/5278* (2013.01)

(58) Field of Classification Search
CPC ... H01L 51/50; H01L 51/504; H01L 51/5076; H01L 51/5278
See application file for complete search history.

(56) References Cited

U.S. PATENT DOCUMENTS

2011/0073844 A1* 3/2011 Pieh ................ H01L 51/5036
257/40
2011/0175072 A1* 7/2011 Ooishi ............... H01L 51/5016
257/40
2012/0161111 A1* 6/2012 Chiang .............. H01L 27/3209
257/40
2015/0155519 A1  6/2015 Lee
2015/0188073 A1* 7/2015 Ahn .................. H01L 27/3209
257/40
2015/0280158 A1* 10/2015 Ogiwara ........... H01L 51/5044
257/40
2016/0254474 A1* 9/2016 Zou .................... H01L 51/5221
257/40

FOREIGN PATENT DOCUMENTS

JP        2004235168 A    8/2004
KR     2012-0139032 A    12/2012

OTHER PUBLICATIONS

Extended European Search Report for European Patent Application No. EP 16180591.6, dated Jan. 31, 2017, 8 Pages.

* cited by examiner

*Primary Examiner* — Phuc Dang
(74) *Attorney, Agent, or Firm* — Fenwick & West LLP

(57) ABSTRACT

An organic light-emitting device includes a first electrode and a second electrode, a first organic emission layer disposed between the first electrode and the second electrode and comprising a first dopant, and a second organic emission layer disposed between the first electrode and the second electrode and comprising a second dopant. The maximum luminescence wavelength of the first dopant may be larger than the maximum luminescence wavelength of the second dopant. The difference between the maximum luminescence wavelength of the first dopant and the maximum luminescence wavelength of the second dopant is 10 nm or less.

20 Claims, 6 Drawing Sheets

| ORGANIC EMISSION LAYER DOPING CONDITIONS | Volt | mA/cm² | cd/A | lm/W | CIE_x | CIE_y | LIFESPAN (hrs) |
|---|---|---|---|---|---|---|---|
| LONG-WAVELENGTH DOPANT (3%) | 4.0 | 10.0 | 2.0 | 1.6 | 0.145 | 0.040 | 500 |
| SHORT-WAVELENGTH DOPANT (3%) | 3.9 | 10.0 | 4.5 | 3.6 | 0.144 | 0.040 | 200 |

FIG. 2

| | STRUCTURE | | Volt | cd/A | CIE_x | CIE_y |
|---|---|---|---|---|---|---|
| | FIRST ORGANIC EMISSION LAYER | SECOND ORGANIC EMISSION LAYER | | | | |
| DOPING CONDITION 1 | DOPANT DOPING (3%) | DOPANT DOPING (3%) | 7.4 | 10.5 | 0.135 | 0.066 |
| DOPING CONDITION 2 | — | DOPANT DOPING (3%) | 7.5 | 10 | 0.135 | 0.066 |
| DOPING CONDITION 3 | DOPANT DOPING (3%) | — | 7.6 | 7.5 | 0.135 | 0.066 |

FIG. 3

| | LINE INDICATED IN FIG. 6 | STRUCTURE | | Volt | mA/cm² | cd/A | CIE_x | CIE_y |
|---|---|---|---|---|---|---|---|---|
| | | FIRST ORGANIC EMISSION LAYER | SECOND ORGANIC EMISSION LAYER | | | | | |
| COMPARARIVE EXAMPLE 1 | —— | FIRST DOPANT | FIRST DOPANT | 7.1 | 6.5 | 10.0 | 0.138 | 0.060 |
| COMPARARIVE EXAMPLE 2 | – – – | SECOND DOPANT | SECOND DOPANT | 7.2 | 5.9 | 10.7 | 0.138 | 0.060 |
| EXAMPLE 1 | — — | FIRST DOPANT | SECOND DOPANT | 7.2 | 6.5 | 10.5 | 0.138 | 0.060 |
| EXAMPLE 2 | ······ | SECOND DOPANT | FIRST DOPANT | 7.1 | 6.6 | 9.9 | 0.139 | 0.060 |
| EXAMPLE 3 | —▲— | FIRST DOPANT : SECOND DOPANT (2:1) | FIRST DOPANT : SECOND DOPANT (1:2) | 7.2 | 6.0 | 10.5 | 0.138 | 0.060 |

FIG. 5

ORGANIC LIGHT-EMITTING DEVICE

CROSS-REFERENCE TO RELATED APPLICATIONS

This application claims the priority of Republic of Korea Patent Application No. 10-2015-0123252 filed on Aug. 31, 2015, in the Korean Intellectual Property Office, the disclosure of which is incorporated herein by reference in its entirety.

BACKGROUND

Technical Field

The present disclosure relates to an organic light-emitting device. More specifically, the present disclosure relates to an organic light-emitting device having a 2-stack structure that can achieve a desired color quality while improving efficiency and lifespan.

Description of the Related Art

An organic light-emitting display (OLED) apparatus is a self-luminance display apparatus. An OLED apparatus utilizes an organic light-emitting device in which electrons from a cathode and holes from an anode are injected into an emission layer, and the electrons and holes recombine to form excitons, such that light is emitted when the excitons change from an excited state to the ground state.

OLED apparatuses can be sorted into a top emission OLED apparatus, a bottom emission OLED apparatus, and a dual emission OLED apparatus depending on the direction in which light exits. Further, OLED apparatuses can be sorted into an active matrix OLED apparatus and a passive matrix OLED apparatus depending on the driving manner.

An OLED apparatus does not require a separate light source, unlike a liquid crystal display (LCD) apparatus. Thus, the OLED apparatus can be made lighter and thinner than an LCD apparatus. Further, an OLED device has advantages in that it is driven with low voltage to consume less power, and in that it can represent vivid colors, has short response time, wide viewing angle, and a good contrast ratio (CR). For these reasons, an OLED device is currently under development as the next generation display device.

As high-definition displays become more prominent, the number of pixels per area increases, and high luminance is required. However, the electric current per area is limited by the structure of an OLED apparatus. In addition, as the amount of applied current increases, reliability of an OLED display is degraded, and power consumption increases.

Accordingly, in order to improve quality and productivity of OLED apparatuses, it is necessary to overcome certain technical limitations such as luminous efficiency, lifespan, and power consumption of organic light-emitting devices. There are a variety of on-going research activities with respect to organic light-emitting devices capable of improving luminous efficiency, lifespan, and viewing angle without compromising desired color quality.

SUMMARY

In order to improve the performance, quality and productivity of OLED apparatuses, a variety of organic light-emitting device structures have been proposed for increasing the efficiency and lifespan of organic light-emitting devices while reducing power consumption.

In addition to a single-stack structure that employs a single stack, i.e., a single electroluminescence (EL) unit, organic light-emitting devices having a multi-stack structure that employs multiple stacks, i.e., a plurality of EL units for improving efficiency and elongating lifespan have been proposed.

Among organic light-emitting devices employing multi-stack structure of EL units, an organic light-emitting device having a 2-stack structure includes a first EL unit and a second EL unit, in each of which an emission region where electrons and holes recombine is located. Such an organic light-emitting device having a 2-stack structure can achieve higher efficiency than an existing organic light-emitting device having a single-stack structure and can be driven with a lower current and thus improves the lifespan of the organic light-emitting device.

Further, an existing organic light-emitting device having a 2-stack structure includes two organic emission layers between an anode and a cathode. In order to achieve a desired color quality, efficiency and lifespan, the same dopant material is applied to both of the two organic emission layers.

This is to achieve a desired color quality, and the same dopant as the one used in a single-stack structure, which exhibits short-wavelength characteristics, is also applied to a 2-stack structure. As a result, there are only a few choices of dopants applicable to the organic emission layers to meet all of the color quality, efficiency, and lifespan requirements of an organic light-emitting device having a 2-stack structure.

For example, if a dopant exhibiting long-wavelength characteristics is applied to both of the two organic emission layers of an organic light-emitting device having a 2-stack structure, the lifespan can be improved but a desired color quality may not be achieved. On the other hand, if only a dopant exhibiting short-wavelength characteristics is applied to both of the two organic emission layers, a desired color quality could be achieved in the structure requiring a high color gamut, while the lifespan may be drastically shortened.

In view of the above, an objective of the present disclosure is to provide an organic light-emitting device having a 2-stack structure that can achieve a desired color quality while improving the efficiency and lifespan.

It should be noted that objectives of the present disclosure are not limited to the above-described objects, and other objects of the present disclosure will be apparent to those skilled in the art from the following descriptions.

According to exemplary embodiments of the present disclosure, an organic light-emitting device having a 2-stack structure that can achieve a desired color quality while improving the efficiency and lifespan is disclosed.

According to an aspect of the present disclosure, there is provided an organic light-emitting device comprising: a first electrode and a second electrode; a first organic emission layer disposed between the first electrode and the second electrode and comprising a first dopant; and a second organic emission layer disposed between the first electrode and the second electrode and comprising a second dopant. The maximum luminescence wavelength of the first dopant may be larger than the maximum luminescence wavelength of the second dopant.

According to another aspect of the present disclosure, there is provided an organic light-emitting device comprising: a first electroluminescence (EL) unit comprising a first organic emission layer between a first electrode and a first charge generation layer; and a second EL unit comprising a second organic emission layer between a second charge generation layer and a second electrode; wherein each of the first organic emission layer and the second organic emission layer comprises a first dopant and a second dopant, a concentration of the first dopant in the first organic emission layer is higher than a concentration of the second dopant in the first organic emission layer such that lifespan of the organic light-emitting device is improved compared to an organic light-emitting device having same concentrations of the first dopant and the second dopant in each of the first organic emission layer and the second organic emission layer, and a concentration of the second dopant in the second organic emission layer is higher than a concentration of the first dopant in the second organic emission layer such that efficiency of the organic light-emitting device is increased compared to an organic light-emitting device having same concentrations of the first dopant and the second dopant in each of the first organic emission layer and the second organic emission layer.

According to exemplary embodiments of the present disclosure, in an organic light-emitting device having a 2-stack structure using two EL units, the concentration of a first dopant in a first organic emission layer of a first EL unit is larger than the concentration of a second dopant in the first organic emission layer of the first EL unit, the concentration of a second dopant in a second organic emission layer of a second EL unit is larger than the concentration of a first dopant in the second organic emission layer of the second EL unit, and the maximum luminescence wavelength of the first dopant is larger than the maximum luminescence wavelength of the second dopant, such that a desired color quality can be achieved while the efficiency and lifespan can be improved.

It should be noted that effects of the present disclosure are not limited to those described above and other effects of the present disclosure will be apparent to those skilled in the art from the following descriptions.

The summary is not meant to specify essential features of the appended claims, and thus the scope of the claims is not limited thereby.

BRIEF DESCRIPTION OF THE DRAWINGS

The above and other aspects, features and other advantages of the present disclosure will be more clearly understood from the following detailed description taken in conjunction with the accompanying drawings.

FIG. 2 is a table showing evaluation results of device characteristics depending on doping conditions of long-wavelength and short-wavelength dopants of a blue organic light-emitting device according to an exemplary embodiment of the present disclosure.

FIG. 3 is a table showing evaluation results of device characteristics depending on doping conditions of a first organic emission layer and a second organic emission layer of a blue organic light-emitting device having a 2-stack structure according to an exemplary embodiment of the present disclosure.

FIG. 5 is a table showing evaluation results of device characteristics depending on doping conditions of a first organic emission layer and a second organic emission layer of a blue organic light-emitting device having a 2-stack structure according to an exemplary embodiment of the present disclosure.

DETAILED DESCRIPTION OF THE PREFERRED EMBODIMENT

Figure 1:
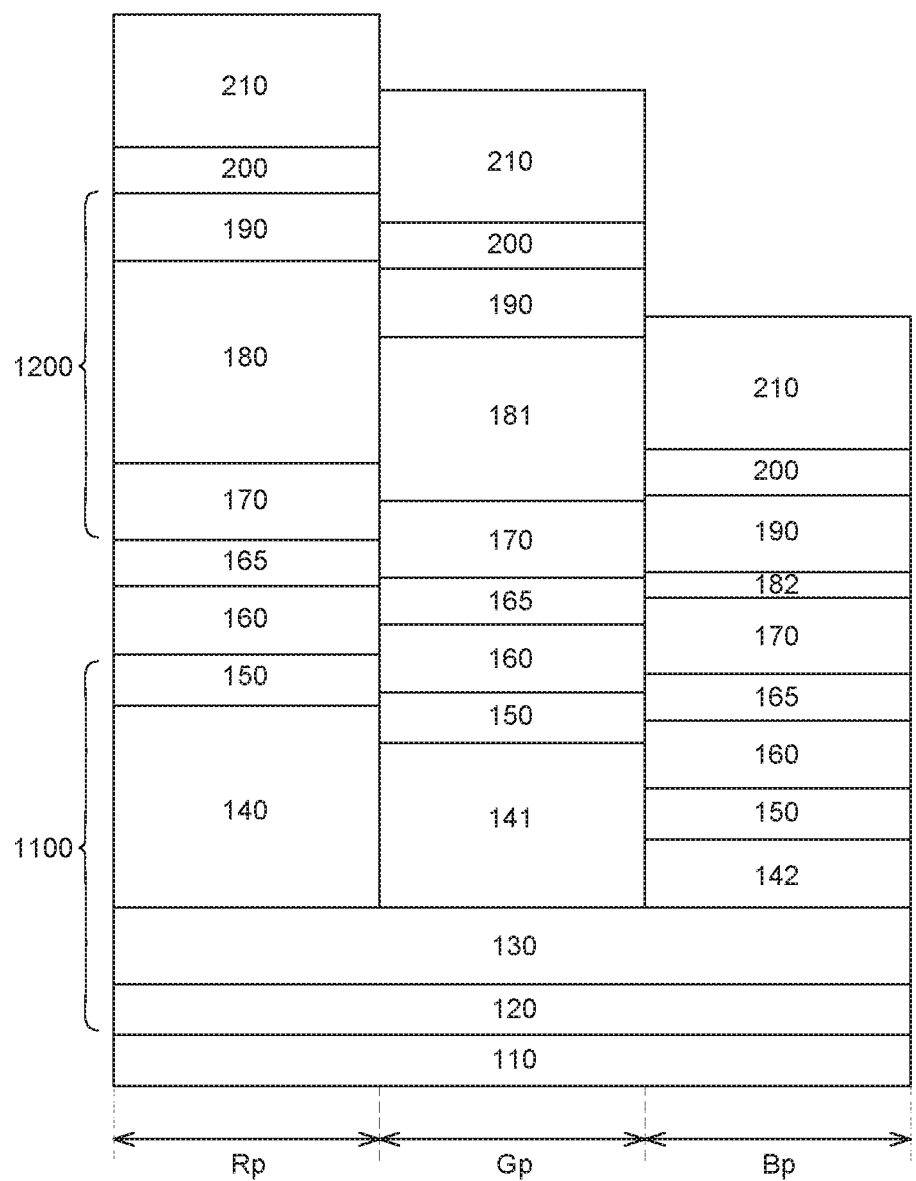
FIG. 1 is a cross-sectional view schematically showing an organic light-emitting device according to an exemplary embodiment of the present disclosure.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements. In describing positional relationship, such as "an element A on an element B," "an element A above an element B," "an element A below an element B" and "an element A next to an element B," another element C may be disposed between the elements A and B unless the term. "directly" or "immediately" is explicitly used.

As used herein, the terms first, second, etc., are used for distinguishing between similar elements and not necessarily for describing a sequential or chronological order. These terms are used to merely distinguish one element from another. Accordingly, as used herein, a first element may be a second element within the technical scope of the present disclosure.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

FIG. 1 is a cross-sectional view schematically showing an organic light-emitting device according to an exemplary embodiment of the present disclosure.

Referring to FIG. 1, an organic light-emitting device 1000 according to an exemplary embodiment of the present disclosure includes a first electrode (anode) 110 formed on a substrate where a red sub-pixel region Rp, a green sub-pixel region Gp and a blue sub-pixel Bp are defined, a hole injection layer (HIL) 120, a first hole transport layer (1st HTL) 130, a first organic emission layer including a first red emission layer (1st Red EML) 140, a first green emission layer (1st Green EML) 141 and a first blue emission layer (1st Blue EML) 142; a first electron transport layer (1st ETL) 150; a first charge generation layer (N-CGL) 160; a second charge generation layer (P-CGL) 165; a second hole transport layer (2nd HTL) 170, a second organic emission layer including a second red emission layer (2nd Red EML) 180, a second green emission layer (2nd Green EML) 181, and a second blue emission layer (2nd Blue EML) 182; a second electron transport layer (2nd ETL) 190; a second electrode (cathode) 200; and a capping layer (CPL) 210.

In addition, referring to FIG. 1, the organic light-emitting device 1000 according to the exemplary embodiment of the present disclosure has a 2-stack structure in which a first EL unit 1100 including a first organic emission layer and a second EL unit 1200 including a second organic emission layer are stacked on one another and are between the first electrode 110 and the second electrode 200.

More specifically, the first EL unit 1100 of the organic light-emitting device 1000 according to the exemplary embodiment of the present disclosure includes a hole injection layer 120, a first hole transport layer 130, a first organic emission layer and a first electron transport layer 150. The first organic emission layer includes a first red emission layer 140, a first green emission layer 141 and a first blue emission layer 142.

The second EL unit 1200 of the organic light-emitting device 1000 according to the exemplary embodiment of the present disclosure includes a second hole transport layer 170; a second organic emission layer and a second electron transport layer 190. The second organic emission layer includes a second red emission layer 180, a second green emission layer 181 and a second blue emission layer 182.

In addition, the organic light-emitting device 1000 according to the exemplary embodiment of the present disclosure includes a first charge generation layer 160 that is an n-type charge generation layer and a second charge generation layer 165 that is a p-type charge generation layer between the first EL unit 1100 and the second EL unit 1200.

An OLED apparatus including the organic light-emitting device 1000 according to the exemplary embodiment of the present disclosure also includes gate lines and data lines that are disposed on the substrate having pixel regions, and one or more power lines extending in parallel with the gate lines and/or the data lines. In each of the pixel regions, a switching thin-film transistor connected to the gate lines and the data lines, and a driving thin-film transistor connected to the switching thin-film transistor are disposed. The driving thin-film transistor is electrically connected to the first electrode 110, i.e., an anode.

The first electrode 110 may be disposed on the substrate such that it covers each of a red sub-pixel region Rp, a green sub-pixel region Gp, and a blue sub-pixel region Bp. The first electrode 110 may be a reflective electrode. For example, the first electrode 110 may include a transparent conductive material layer having a high work function such as indium-tin-oxide (ITO), and a reflective material layer made of silver (Ag) or a silver alloy (Ag alloy).

The hole injection layer 120 is disposed on the first electrode 110 corresponding to all of the red sub-pixel region Rp, the green sub-pixel region Gp and the blue sub-pixel region Bp.

The hole injection layer 120 may serve to facilitate hole injection and may be made of, but is not limited to, at least one selected from the group consisting of HATCN(1,4,5,8, 9,11-hexaazatriphenylene-hexanitrile), CuPc(cupper phthalocyanine), PEDOT(poly(3,4)-ethylenedioxythiophene), PANI(polyaniline) and NPD(N,N-dinaphthyl-N,N'-diphenylbenzidine).

Each of the first hole transport layer 130 and the second hole transport layer 170 corresponds to all of the red sub-pixel region Rp, the green sub-pixel region Gp, and the blue sub-pixel region Bp. The first hole transport layer 130 is disposed on the hole injection layer 120, and the second hole transport layer 170 is disposed on the second charge generation layer 165.

The first hole transport layer 130 and the second hole transport layer 170 may serve to facilitate hole transport and may be made of, but is not limited to, at least one selected from the group consisting of NPD(N,N-dinaphthyl-N,N'-diphenylbenzidine), TPD(N,N'-bis-(3-methylphenyl)-N,N'-bis-(phenyl)-benzidine), s-TAD and MTDATA(4,4',4"-Tris (N-3-methylphenyl-N-phenyl-amino)-triphenyl amine).

Referring to FIG. 1, the first red emission layer 140 of the first EL unit 1100 is disposed in the red sub-pixel region Rp on the first hole transport layer 130. In addition, the second red emission layer 180 of the second EL unit 1200 is disposed in the red sub-pixel region Rp on the second hole transport layer 170. Each of the first red emission layer 140 and the second red emission layer 180 may include a luminous material that emits red light. The luminous material may be formed using a phosphorescence material and/or a fluorescence material.

More specifically, each of the first red emission layer 140 and the second red emission layer 180 may include a host material including CBP(4,4'-bis(carbozol-9-yl)biphenyl) or mCP(1,3-bis(N-carbozolyl)benzene). In addition, each of the first red emission layer 140 and the second red emission layer 180 may be made of, but is not limited to, a phosphorescence material containing a dopant including at least one selected from the group consisting of PQIr(acac) (bis(1-phenylquinoline) acetylacetonate iridium), PQIr(tris(1-phenylquinoline) iridium) and PtOEP(octaethylporphyrin platinum) or a fluorescence material including PBD:Eu(DBM)3 (Phen) or perylene.

Referring to FIG. 1, the first green emission layer 141 of the first EL unit 1100 is disposed in the green sub-pixel region Gp on the first hole transport layer 130. The second green emission layer 181 of the second EL unit 1200 is disposed in the green sub-pixel region Gp on the second hole transport layer 170. Each of the first green emission layer 141 and the second green emission layer 181 may include a luminous material that emits green light. The luminous material may be formed using a phosphorescence material or a fluorescence material.

More specifically, each of the first green emission layer 141 and the second green emission layer 181 may include a host material including CBP or mCP. In addition, each of the first green emission layer 141 and the second green emission layer 181 may be made of, but is not limited to, a phosphorescence material containing a dopant material such as Ir complex including Ir(ppy)$_3$(fac tris(2-phenylpyridine) iridium) or a fluorescence material including Alq$_3$(tris(8-hydroxyquinolino)aluminum).

Referring to FIG. 1, the first blue emission layer 142 of the first EL unit 1100 is disposed in the blue sub-pixel region Bp on the first hole transport layer 130. The second blue emission layer 182 of the second EL unit 1200 is disposed in the blue sub-pixel region Bp on the second hole transport layer 170. Each of the first blue emission layer 142 and the second blue emission layer 182 may include a luminous material that emits blue light. The luminous material may be formed using a phosphorescence material and/or a fluorescence material.

More specifically, the first blue emission layer 142 and the second blue emission layer 182 may include a host material including CBP or mCP and may be made of a phosphorescent material containing a dopant material including (4,6-F2ppy)2Irpic. In addition, the blue emission layer 142 may be made of, but is not limited to, a fluorescent material including one selected from the group consisting of spiro-DPVBi, spiro-6P, distytylbenzene (DSB), distyrylarylene (DSA), a PFO-based polymer, and a PPV-based polymer.

In addition, referring to FIG. 1, the first electron transport layer 150 is disposed on the first red emission layer 140, the first green emission layer 141 and the first blue emission layer 142 corresponding to all of the red sub-pixel region Rp, the green sub-pixel region Gp, and the blue sub-pixel region Bp. The second electron transport layer 190 is disposed on the second red emission layer 180, the second green emission layer 181 and the second blue emission layer 182 corresponding to all of the red sub-pixel region Rp, the green sub-pixel region Gp, and the blue sub-pixel region Bp.

The first electron transport layer 150 and the second electron transport layer 190 may perform transport and injection of electrons. The thickness of each of the first electron transport layer 150 and the second electron transport layer 190 may be adjusted depending on the electron transport characteristics.

The first electron transporting layer 150 and the second electron transport layer 190 may serve to facilitate electron transport and may be made of, but is not limited to, at least one selected from the group consisting of $Alq_3$(tris(8-hydroxyquinolino)aluminum), PBD(2-(4-biphenylyl)-5-(4-tert-butylpheny)-1,3,4oxadiazole), TAZ, Spiro-PBD, BAlq and SAlq.

An additional electron injection layer (EIL) may be further disposed on the second electron transport layer 190.

The electron injection layer (EIL) may be formed using, but is not limited to, $Alq_3$(tris(8-hydroxyquinolino)aluminum), PBD(2-(4-biphenylyl)-5-(4-tert-butylpheny)-1,3,4oxadiazole), TAZ, Spiro-PBD, BAlq or SAlq.

It is to be understood that the structure of the organic light-emitting device 1000 is not limited to that of the above-described embodiment of the present disclosure. At least one of the hole injection layer 120, the first hole transport layer 130, the second hole transport layer 170, the first electron transport layer 150, the second electron transport layer 190 and the electron injection layer EIL may be eliminated and/or its functionality may be combined together or included into another layer. In addition, at least one of the first hole transport layer 130, the second hole transport layer 170, the first electron transport layer 150, the second electron transport layer 190 and the electron injection layer EIL may be made up of two or more layers.

The first charge generation layer 160 may be disposed on the first electron transporting layer 150 corresponding to all of the red sub-pixel region Rp, the green sub-pixel region Gp, and the blue sub-pixel region Bp. The second charge generation layer 165 may be disposed on the first charge generation layer 160 corresponding to all of the red sub-pixel region Rp, the green sub-pixel region Gp, and the blue sub-pixel region Bp. The first charge generation layer 160 and the second charge generation layer 165 may be configured as n-p junction structure.

Referring to FIG. 1, the first charge generation layer 160 and the second charge generation layer 165 is disposed between the first EL unit 1100 and the second EL unit 1200.

The first charge generation layer 160 and the second charge generation layer 165 adjusts balance of charges between the first EL unit 1100 and the second EL unit 1200.

The first charge generation layer 160 works as an n-type charge generation layer (n-CGL) that facilitates injection of electrons to the first EL unit 1100 disposed thereunder. The second charge generation layer 165 works as a p-type charge generation layer (p-CGL) that facilitates injection of holes to the second EL unit 1200 disposed thereon.

More specifically, the first charge generation layer 160, which works as an n-type charge generation layer (n-CGL) for electron injection, may be made of alkali metal, alkali metal compound, or organic material for electron injection or a compound thereof. In addition, the host material of the first charge generation layer 160 may be made of the same material as the first electron transport layer 150 and the second electron transport layer 190. For example, the host material may be configured to as, but is not limited to, a mixture layer formed by doping a dopant such as lithium (Li) in an organic material such as an anthracene derivative.

The second charge generation layer 165 is disposed on the first charge generation layer 160. The second charge generation layer 165 works as a p-type charge generation layer (p-CGL) that performs injection of holes. The host material of the second charge generation layer 165 may be made of the same material as the first hole injection layer 120, the first hole transport layer 130 and the second hole transport layer 170. For example, the host material may be configured as, but is not limited to, a mixture layer formed by doping a p-type dopant in an organic material such as HATCN(1, 4,5,8,9,11-hexaazatriphenylene-hexanitrile), CuPc(cupper phthalocyanine) and TBAHA(tris(4-bromophenyl)aluminum hexacholroantimonate). The p-type dopant may be, but is not limited to, $F_4$-TCNQ or NDP-9.

The second electrode 200 may be disposed on the second electron transport layer 190 corresponding to all of the red sub-pixel region Rp, the green sub-pixel region Gp, and the blue sub-pixel region Bp. For example, the second electrode 200 may be made of an alloy of magnesium and silver (Mg:Ag) so that it has transflective property. That is, some of the light generated in the emission layer exit through the transflective second electrode 200, and other light is reflected in the second electrode 200 and travel back to the first electrode 100.

As such, by virtue of such micro cavity effect in which light is reflected between the first electrode 110 and the second electrode 200 working as reflective layers, light is reflected repeatedly between the first electrode 110 and the second electrode 200, such that the optical efficiency is increased.

It is also possible to form the first electrode 110 as a transparent electrode and the second electrode 200 as a reflective electrode, so that light generated in the emission layer exits through the first electrode 110.

A capping layer 210 (or some other layer having similar functionality) is disposed on the second electrode 200. The capping layer 210 may increase the efficiency of light outcoupling for the organic light-emitting device. The capping layer 210 may be made of one of the materials of the first hole transport layer 130 and the second hole transport layer 170, the materials of the first electron transport layer 150 and the second electron transport layer 190, and the host materials of the first red emission layer 140 and the second red emission layer 180, the first green emission layer 141 and the second green emission layer 181, the first blue emission layer 142 and the second blue emission layer 182. The capping layer 210 may be eliminated if necessary.

In the related art, for producing an organic light-emitting device having a single-stack structure of a single organic emission layer or an organic light-emitting device having a 2-stack structure of two organic light-emitting devices, a dopant appropriate for a desired color quality is applied to the organic emission layer(s) to produce the organic light-emitting device. For an organic light-emitting device having a 2-stack structure in the related art, a dopant having the same maximum luminescence wavelength characteristics was applied to two organic emission layers disposed between an anode and a cathode, to achieve a desired color quality, efficiency and lifespan.

If an OLED apparatus does not require high-level color quality, only a dopant exhibiting long-wavelength characteristics is applied to the two organic emission layers, to meet the color quality and lifespan.

However, when high color gamut is required, it is advantageous to apply a dopant exhibiting short-wavelength characteristics to achieve deep color compared to existing display apparatuses. Such a dopant exhibiting short-wavelength characteristics has a molecule structure with high energy and thus the structure is not stable compared to a dopant exhibiting long-wavelength characteristics. Therefore, a dopant exhibiting short-wavelength characteristics is disadvantageous in term of durability of the material. As a result, lifespan of the display apparatus may be shortened.

Accordingly, for an existing organic light-emitting device having a 2-stack structure, there are only a few choices of dopants applicable to the first and second organic emission layers to meet all of the properties of color quality, efficiency and lifespan of the device.

To overcome the above-mentioned problem, in an organic light-emitting device 1000 according to an exemplary embodiment of the present disclosure, a first organic emission layer of a first EL unit 1100 may include a first red emission layer 140, a first green emission layer 141 and a first blue emission layer 142, and the first red emission layer 140, the first green emission layer 141 and the first blue emission layer 142 may include a first dopant. In addition, in an organic light-emitting device according to another exemplary embodiment of the present disclosure, the first red emission layer 140, the first green emission layer 141 and the first blue emission layer 142 may include a second dopant in addition to the first dopant.

In addition, in the organic light-emitting device 1000 according to an exemplary embodiment of the present disclosure, a second organic emission layer of a second EL unit 1200 may include a second red emission layer 180, a second green emission layer 181 and a second blue emission layer 182, and the second red emission layer 180, the second green emission layer 181 and the second blue emission layer 182 may include a second dopant. In addition, in an organic light-emitting device according to another exemplary embodiment of the present disclosure, the second red emission layer 180, the second green emission layer 181 and the second blue emission layer 182 may include a first dopant in addition to the second dopant.

The maximum luminescence wavelength of the first dopant may be larger than the maximum luminescence wavelength of the second dopant. More specifically, the first dopant included in the first organic emission layer may exhibit long-wavelength characteristics compared to the second dopant included in the second organic emission layer. In addition, the first dopant included in the first organic emission layer may exhibit long-wavelength characteristics compared to the second dopant included in the first organic emission layer. The difference between the maximum luminescence wavelength of the first dopant and the maximum luminescence wavelength of the second dopant is equal to 10 nm or less, for example 5 nm.

In addition, the maximum luminescence wavelength of the second dopant may be smaller than the maximum luminescence wavelength of the first dopant. More specifically, the second dopant included in the second organic emission layer may exhibit short-wavelength characteristics compared to the first dopant included in the first organic emission layer. In addition, the second dopant included in the second organic emission layer may exhibit short-wavelength characteristics compared to the first dopant included in the second organic emission layer. The difference between the maximum luminescence wavelength of the first dopant and the maximum luminescence wavelength of the second dopant is equal to 10 nm or less, for example 5 nm.

That is, the organic light-emitting device having a 2-stack structure according to an exemplary embodiment of the present disclosure includes a first EL unit 1100 and a second EL unit 1200, and each of a first organic emission layer of the first EL unit 1100 and a second organic emission layer of the second EL unit 1200 includes a first dopant and a second dopant, the maximum luminescence wavelength of the second dopant being smaller than the maximum luminescence wavelength of the first dopant. By setting the concentration of the first dopant in the first organic emission layer to be higher than the concentration of the second dopant in the first organic emission layer, the lifespan of the organic light-emitting device can be improved compared to existing organic light-emitting devices. In addition, by setting the concentration of the second dopant in the second organic emission layer to be higher than the concentration of the first dopant in the second organic emission layer, the efficiency of the organic light-emitting device can be improved compared to existing organic light-emitting devices. The existing organic light-emitting devices are the organic light-emitting devices having same concentrations of the first dopant and the second dopant in each of the first organic emission layer and the second organic emission layer.

In addition, the concentration of the second dopant in the first organic emission layer of the first emission unit 1100 may be set to be smaller than the concentration of the first dopant in the first organic emission layer of the first EL unit 1100. More specifically, the concentration of the second dopant may be 50% of the concentration of the first dopant or less. That is, in the first organic emission layer, the concentration of the first dopant having long-wavelength characteristics may be set to be larger than the concentration of the second dopant having short-wavelength characteristics.

In addition, in the second organic emission layer of the second EL unit 1200, the concentration of the first dopant may be set to be smaller than the concentration of the second dopant. More specifically, in the second organic emission layer, the concentration of the first dopant may be 50% of the concentration of the second dopant or less. That is, in the second organic emission layer, the concentration of the second dopant having short-wavelength characteristics may be set to be larger than the concentration of the first dopant having long-wavelength characteristics.

In addition, when the first organic emission layer consisting of the first red emission layer 140, the first green emission layer 141 and the first blue emission layer 142 includes only the first dopant and the second organic emission layer consisting of the second red emission layer 180, the second green emission layer 181 and the second blue emission layer 182 includes only the second dopant, the doping concentration of the first dopant and the doping concentration of the second dopant may range from 1% to 10% relative to a host material included in the organic emission layers, and the doping concentration of the second dopant in the second organic emission layer may be equal to or smaller than the doping concentration of the first dopant in the first organic emission layer.

Such first organic emission layer and the second organic emission layer including the first and second dopants may be formed selectively in at least one of red sub-pixel regions, green sub-pixel regions, and blue sub-pixel regions.

In addition, when the first organic emission layer consisting of the first red emission layer 140, the first green emission layer 141 and the first blue emission layer 142 includes the first dopant and the second dopant and the second organic emission layer consisting the second red emission layer 180, the second green emission layer 181 and the second blue emission layer 182 includes the first dopant and the second dopant, the sum of the doping concentrations of the first dopant and the second dopant in each of the first and second organic emission layers may range from 1% to 10% relative to a host material included in the organic emission layers, and the sum of the doping concentrations of the first and second dopants in the second organic emission layer may be equal to or smaller than the sum of the doping concentrations of the first and second dopants in the first organic emission layer.

That is, for an organic light-emitting device having a 2-stack structure, by setting the concentration of the first dopant that exhibits long-wavelength characteristics and is advantageous in terms of lifespan to be higher than the concentration of the second dopant in the first organic emission layer of the first EL unit 1100 and setting the concentration of the second dopant that exhibits short-wavelength characteristics and is advantageous in terms of efficiency to be higher than the concentration of the first dopant in the second organic emission layer of the second EL unit 1200, a desired color quality can be achieved while improving efficiency and lifespan of the organic light-emitting device.

FIG. 2 is a table showing evaluation results of device characteristics depending on doping conditions of long-wavelength and short-wavelength dopants of a blue organic light-emitting device according to an exemplary embodiment of the present disclosure.

More specifically, the table in FIG. 2 compares the electro-optical characteristics of a blue organic light-emitting device having 3% of a dopant exhibiting long-wavelength characteristics driven in order to achieve the color quality of 0.040 in the color coordinate (CIE_y) with the electro-optical characteristics of a blue organic light-emitting device having 3% of a dopant exhibiting short-wavelength characteristics driven in order to achieve the color quality of 0.040 in the color coordinate (CIE_y).

In this evaluation, the dopant exhibiting long-wavelength characteristics has the maximum luminescence wavelength of approximately 466 nm, and the dopant exhibiting short-wavelength characteristics has the maximum luminescence wavelength of approximately 456 nm. The difference in the maximum luminescence wavelength between the two dopants was approximately 10 nm. Preferably, the color quality of the same level could be achieved in the two organic light-emitting devices when the difference in the maximum luminescence wavelength between the two dopants was 10 nm or less.

Referring to FIG. 2, for both of the blue organic light-emitting device doped with 3% of the dopant exhibiting long-wavelength characteristics and the blue organic light-emitting device doped with 3% of the dopant exhibiting short-wavelength characteristics, the driving voltage in V was approximately 4 V, and the driving current density in $mA/cm^2$ was approximately 10 $mA/cm^2$. Accordingly, it can be seen that there was no significant difference in the driving voltage and the driving current density between the two organic light-emitting devices.

However, the efficiency of the blue organic light-emitting device to which the dopant exhibiting short-wavelength characteristics was applied was approximately 4.5 cd/A while the efficiency of the blue organic light-emitting device to which the dopant exhibiting long-wavelength characteristics was applied was approximately 2.0 cd/A. Accordingly, it can be seen that the organic light-emitting device with the short-wavelength dopant exhibited higher efficiency than the organic light-emitting device with the long-wavelength dopant.

In addition, the lifespan of the blue organic light-emitting device to which the dopant exhibiting short-wavelength characteristics was applied was approximately 200 hours while the lifespan of the blue organic light-emitting device to which the dopant exhibiting long-wavelength characteristics was applied was approximately 500 hours. Accordingly, it can be seen that the organic light-emitting device with the long-wavelength dopant exhibited longer lifespan than the organic light-emitting device with the short-wavelength dopant.

It can be concluded based on the results that the dopant exhibiting long-wavelength characteristics results in lower efficiency but longer lifespan while the dopant exhibiting short-wavelength characteristics results in lower lifespan but higher efficiency when the dopant exhibiting long-wavelength characteristics and the dopant exhibiting short-wavelength characteristics are applied in the organic emission layers to achieve the same color quality.

Figure 4:
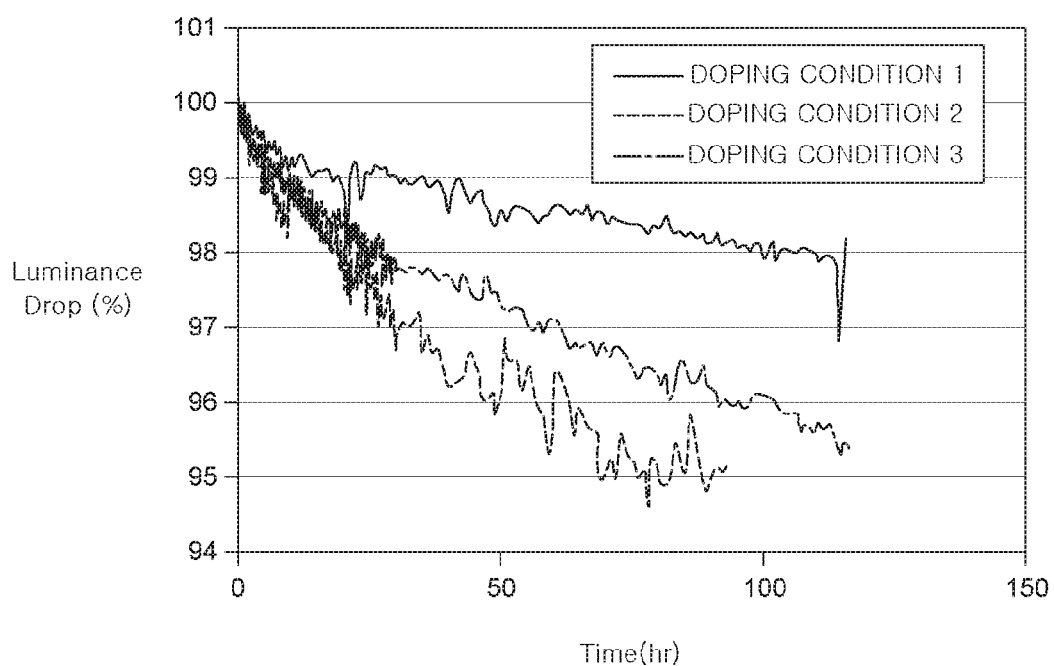
FIG. 4 is a graph showing evaluation results of lifespan depending on doping conditions of a first organic emission layer and a second organic emission layer of a blue organic light-emitting device having a 2-stack structure according to an exemplary embodiment of the present disclosure.

FIG. 3 is a table showing evaluation results of device characteristics depending on doping conditions of a first organic emission layer and a second organic emission layer of a blue organic light-emitting device having a 2-stack structure according to an exemplary embodiment of the present disclosure. FIG. 4 is a graph showing evaluation results of lifespan depending on doping conditions of a first organic emission layer and a second organic emission layer of a blue organic light-emitting device having a 2-stack structure. That is, FIGS. 3 and 4 compare the efficiencies and lifespans of a blue organic light-emitting device having a 2-stack structure depending on doping conditions 1 to 3 applied to a first organic emission layer and a second organic emission layer.

In doping condition 1, 3% of the dopant was doped into each of the first blue emission layer and the second blue emission layer. In doping condition 2, 3% of the dopant was doped into the second blue emission layer only. In doping condition 3, 3% of the dopant was doped into the first blue emission layer only. Blue organic light-emitting devices were produced in conditions 1 to 3, respectively, and electro-optical characteristics of each of devices were evaluated.

Referring to FIG. 3, the driving voltages and color coordinates values of the blue organic light-emitting devices were similar in doping conditions 1 to 3. However, the efficiency of the blue organic light-emitting device in doping condition 3 in which 3% of the dopant was doped into the first blue emission layer only exhibited 7.5 cd/A. This efficiency is lower than the efficiencies of the blue organic light-emitting devices in doping conditions 1 and 2, i.e., approximately 10 cd/A.

Referring to FIG. 4, the lifespans of the blue organic light-emitting devices in doping conditions 1 to 3, i.e., times taken to reach 95% of luminance from the initial luminance were compared. The lifespan of the blue organic light-emitting device in doping condition 2 in which 3% of the dopant was doped into the second blue emission layer only was shortened compared to the lifespans of the blue organic light-emitting devices in doping conditions 1 and 3.

It can be seen based on the results that the lifespan of the organic light-emitting device having a 2-stack structure may be significantly shortened when no dopant was doped into the first organic emission layer as in doping condition 2 and thus it is preferable that the dopant that exhibits long-wavelength characteristics and is advantageous for lifespan is doped into the first organic emission layer. In addition, it can be seen based on the results that the efficiency of the organic light-emitting device having a 2-stack structure may be significantly shortened when no dopant was doped into the second organic emission layer as in doping condition 3 and thus it is preferable that the dopant that exhibits short-wavelength characteristics and is advantageous for efficiency is doped into the second organic emission layer.

Figure 6:
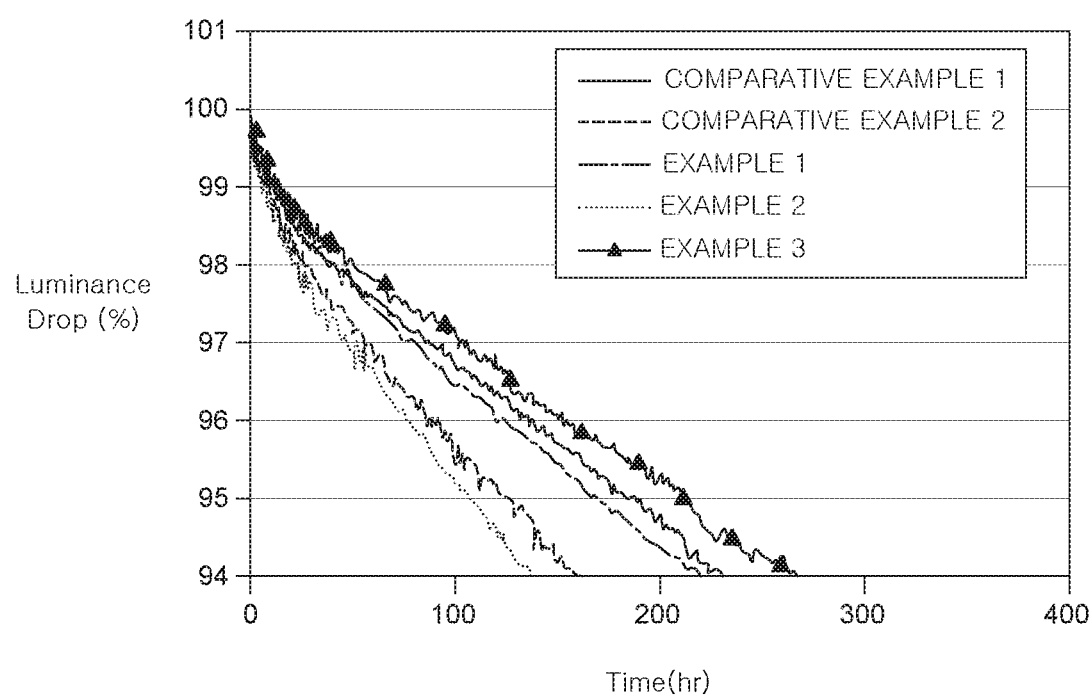
FIG. 6 is a graph showing evaluation results of lifespan depending on doping conditions of a first organic emission layer and a second organic emission layer of a blue organic light-emitting device having a 2-stack structure according to an exemplary embodiment of the present disclosure.

FIG. 5 is a table showing evaluation results of device characteristics depending on doping conditions of a first organic emission layer and a second organic emission layer of a blue organic light-emitting device having a 2-stack structure according to an exemplary embodiment of the present disclosure. FIG. 6 is a graph showing evaluation results of lifespan depending on doping conditions of a first organic emission layer and a second organic emission layer of a blue organic light-emitting device having a 2-stack structure according to an exemplary embodiment of the present disclosure. That is, FIGS. 5 and 6 compare the efficiencies and lifespans of a blue organic light-emitting device having a 2-stack structure depending on first and second doping conditions applied to a first organic emission layer and a second organic emission layer according to Comparative Examples and Examples.

In Comparative Example 1, a first dopant was doped into a first blue emission layer and a second blue emission layer of a blue organic light-emitting device having a 2-stack structure. In Comparative Example 2, a second dopant was doped into a first blue emission layer and a second blue emission layer of a blue organic light-emitting device having a 2-stack structure. The electro-optical characteristics of the blue organic light-emitting devices in Comparative Examples 1 and 2 were compared with each other and evaluated.

In Example 1, the first dopant was doped into a first blue emission layer and the second dopant was doped into a second blue emission layer of a blue organic light-emitting device having a 2-stack structure. In Example 2, the second dopant was doped into a first blue emission layer and the first dopant was doped into a second blue emission layer of a blue organic light-emitting device having a 2-stack structure. In Example 3, the first dopant and the second dopant were doped into a first blue emission layer at the ratio of 2:1 and the first dopant and the second dopant were doped into a second blue emission layer at the ratio of 1:2. The electro-optical characteristics of the blue organic light-emitting devices in Examples 1 to 3 were compared with one another and evaluated.

Referring to FIG. 5 where the driving voltages and color coordinates values of blue organic light-emitting devices in which the first and second dopant doping conditions according to Comparative Examples 1 and 2 Examples 1 to 3 are applied to a first blue emission layer and a second blue emission layer are shown, the driving voltages and color coordinates values were similar with one another, and a desired color quality was achieved at similar driving voltages.

The first dopant applied to the blue organic light-emitting devices having a 2-stack structure according to Comparative Examples and Examples exhibits long-wavelength characteristics and has the maximum luminescence wavelength of approximately 466 nm. In addition, the second dopant exhibits short-wavelength characteristics and has the maximum luminescence wavelength of approximately 456 nm. The difference in the maximum luminescence wavelength between the two dopants was approximately 10 nm. It can be seen based on the results that the first and second organic emission layers of the blue organic light-emitting devices could achieve the color quality of the same level when the difference was 10 nm or less.

Referring to FIG. 5, the efficiency of blue organic light-emitting devices according to Comparative Example 2 and Examples 1 and 3 were 10.5 to 10.7 cd/A while the efficiency of blue organic light-emitting devices according to Comparative Example 1 and Example 2 were 9.9 to 10.0 cd/A, which was decreased.

It can be seen from the result that the efficiency of the blue light-emitting devices according to Comparative Example and Examples 1 and 3 in which the second dopant having short-wavelength characteristics was doped into the second blue emission layer was higher than the efficiency of the blue light-emitting devices according to Comparative Example 1 and Example 2 in which the first dopant having long-wavelength characteristics was doped into the second organic emission layer.

That is, if the second dopant having short-wavelength characteristics is doped into the second organic emission layer and the first dopant having long-wavelength characteristics is applied together as in Example 3, the efficiency of the organic light-emitting device having the 2-stack structure can be further improved by setting the concentration of the second dopant in the second organic emission layer higher than the concentration of the first dopant in the second organic emission layer.

Referring to FIG. 6, lifespans, i.e., a time taken to reach 95% of luminance from the initial luminance, of blue organic light-emitting devices to which the first and second dopant doping conditions according to Comparative Examples 1 and 2, Examples 1 to 3, respectively, were applied were compared with one another. Example 3 exhibited the best lifespan. Comparative Example 2 and Example 2 exhibited lower lifespans than those of Comparative Example 1, Examples 1 and 3.

It can be seen based on the results that Comparative Example 1, Examples 1 and 3 in which the first dopant having long-wavelength characteristics was doped into the first blue emission layer, i.e., the first organic emission layer, exhibited better lifespans than Comparative Example 2 and Example 2 in which the second dopant having short-wavelength characteristics was doped into the first organic emission layer.

That is, if the first dopant having long-wavelength characteristics is doped into the first organic emission layer and the second dopant having short-wavelength characteristics is applied together as in Example 3, the lifespan of the organic light-emitting device having the 2-stack structure can be further improved by setting the concentration of the first dopant in the first organic emission layer higher than the concentration of the second dopant in the first organic emission layer.

In conclusion, an organic light-emitting device having a 2-stack structure can achieve a desired color quality while improving efficiency and lifespan, by applying the dopant that exhibits long-wavelength characteristics and is advantageous in terms of lifespan to a first organic emission layer of a first EL unit at a higher concentration and applying the dopant that exhibits short-wavelength characteristics and is advantageous in terms of efficiency to a second organic emission layer of a second EL unit at a higher concentration.

That is, in an organic light-emitting device having a 2-stack structure according to an exemplary embodiment of the present disclosure, a first dopant exhibiting long-wavelength characteristics and a second dopant exhibiting short-wavelength characteristics are doped into a first organic emission layer of a first EL unit and into a second organic emission layer of a second EL unit, wherein the concentration of the first dopant in the first organic emission layer is higher than that of the second dopant in the first organic emission layer to thereby improve lifespan compared to existing organic light-emitting devices, and the concentration of the second dopant in the second organic emission layer is higher than that of the first dopant in the second organic emission layer to thereby improve the efficiency compared to existing organic light-emitting devices.

In the foregoing description, the evaluation results of the efficiency and lifespan of a blue organic light-emitting device having a 2-stack structure depending on the doping conditions of the first and second dopants doped into the first and second organic emission layers have been described. However, it is also possible to apply the same doping conditions to a red organic light-emitting device and a green organic light-emitting device to achieve a desired color quality, while improving the efficiency and lifespan.

The exemplary embodiments of the present disclosure can also be described as follows.

According to an aspect of the present disclosure, an organic light-emitting device comprises a first electrode and a second electrode, a first organic emission layer disposed between the first electrode and the second electrode and comprising a first dopant, and a second organic emission layer disposed between the first electrode and the second electrode and comprising a second dopant, wherein a maximum luminescence wavelength of the first dopant is larger than a maximum luminescence wavelength of the second dopant.

The difference between the maximum luminescence wavelength of the first dopant and the maximum luminescence wavelength of the second dopant may be 10 nm or less.

The first organic emission layer may further comprise the second dopant, and a concentration of the second dopant in the first organic emission layer may be smaller than a concentration of the first dopant in the first organic emission layer.

The concentration of the second dopant may be 50% of the concentration of the first dopant or less.

The second organic emission layer may further comprise the first dopant, and a concentration of the first dopant in the second organic emission layer may be smaller than a concentration of the second dopant in the second organic emission layer.

The concentration of the first dopant may be 50% of the concentration of the second dopant or less.

Each of a doping concentration of the first dopant and a doping concentration of the second dopant may range from 1% to 10%.

The doping concentration of the second dopant in the second organic emission layer may be equal to or smaller than the doping concentration of the first dopant in the first organic emission layer.

The organic light-emitting device may further comprise a first charge generation layer and a second charge generation layer disposed between the first organic emission layer and the second organic emission layer.

The organic light-emitting device may comprise a red sub-pixel region, a green sub-pixel region, and a blue sub-pixel region, and the first organic emission layer and the second organic emission layer may be disposed in at least one of the red sub-pixel region, the green sub-pixel region and the blue sub-pixel region.

The second organic emission layer may be disposed on the first organic emission layer.

According to another aspect of the present disclosure, an organic light-emitting device comprises a first electroluminescence (EL) unit comprising a first organic emission layer between a first electrode and a first charge generation layer, and a second EL unit comprising a second organic emission layer between a second charge generation layer and a second electrode, wherein each of the first organic emission layer and the second organic emission layer comprises a first dopant and a second dopant, and a concentration of the first dopant in the first organic emission layer is higher than a concentration of the second dopant in the first organic emission layer such that lifespan is improved compared to an organic light-emitting device having same concentrations of the first dopant and the second dopant in each of the first organic emission layer and the second organic emission layer, and a concentration of the second dopant in the second organic emission layer is higher than a concentration of the first dopant in the second organic emission layer such that efficiency is increased compared to an organic light-emitting device having same concentrations of the first dopant and the second dopant in each of the first organic emission layer and the second organic emission layer.

The maximum luminescence wavelength of the first dopant may be larger than the maximum luminescence wavelength of the second dopant.

A sum of a doping concentration of the first dopant and a doping concentration of the second dopant may range from 1% to 10% in each of the first organic emission layer and the second organic emission layer.

A sum of the doping concentration of the first dopant in the second organic emission layer and the doping concentration of the second dopant in the second organic emission layer may be equal to or less than a sum of the doping concentration of the first dopant in the first organic emission layer and the doping concentration of the second dopant in the first organic emission layer.

The difference between the maximum luminescence wavelength of the first dopant and the maximum luminescence wavelength of the second dopant may be 10 nm or less.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The protection scope of the present disclosure must be analyzed in view of the appended claims and equivalents thereto.

What is claimed is:

1. An organic light-emitting device comprising:
   a first electrode;
   a second electrode;
   a first organic emission layer between the first electrode and the second electrode, the first organic emission layer comprising a first dopant; and
   a second organic emission layer between the first electrode and the second electrode, the second organic emission layer comprising a second dopant,
   wherein a maximum luminescence wavelength of the first dopant is larger than a maximum luminescence wavelength of the second dopant,
   wherein the organic light-emitting device comprises a red sub-pixel region, a green sub-pixel region, and a blue sub-pixel region, and
   wherein the first organic emission layer and the second organic emission layer are disposed in at least one of the red sub-pixel region, the green sub-pixel region, and the blue sub-pixel region.

2. The organic light-emitting device of claim 1, wherein a difference between the maximum luminescence wavelength of the first dopant and the maximum luminescence wavelength of the second dopant is 10 nm or less.

3. The organic light-emitting device of claim 2, wherein the first organic emission layer further comprises the second dopant, and
   a concentration of the second dopant in the first organic emission layer is smaller than a concentration of the first dopant in the first organic emission layer.

4. The organic light-emitting device of claim 3, wherein the concentration of the second dopant is 50% of the concentration of the first dopant or less.

5. The organic light-emitting device of claim 2, wherein the second organic emission layer further comprises the first dopant, and
   a concentration of the first dopant in the second organic emission layer is smaller than a concentration of the second dopant in the second organic emission layer.

6. The organic light-emitting device of claim 5, wherein the concentration of the first dopant is 50% of the concentration of the second dopant or less.

7. The organic light-emitting device of claim 1, wherein each of a doping concentration of the first dopant and a doping concentration of the second dopant ranges from 1% to 10%.

8. The organic light-emitting device of claim 7, wherein the doping concentration of the second dopant in the second organic emission layer is equal to or smaller than the doping concentration of the first dopant in the first organic emission layer.

9. The organic light-emitting device of claim 1, further comprising:
   a first charge generation layer and a second charge generation layer between the first organic emission layer and the second organic emission layer.

10. The organic light-emitting device of claim 1, wherein the second organic emission layer is disposed on the first organic emission layer.

11. An organic light-emitting device comprising:
    a first electroluminescence (EL) unit comprising a first organic emission layer between a first electrode and a first charge generation layer, and the first organic emission layer including a first dopant;
    a second EL unit comprising a second organic emission layer between a second charge generation layer and a second electrode, and the second organic emission layer including a second dopant,
    wherein a lifespan of the first EL unit is longer than a lifespan of the second EL unit, and
    wherein an emission efficiency of the second EL unit is better than an efficiency of the first EL unit,
    wherein a maximum luminescence wavelength of the first dopant is larger than a maximum luminescence wavelength of the second dopant,
    wherein the organic light-emitting device comprises a red sub-pixel region, a green sub-pixel region, and a blue sub-pixel region, and
    wherein the first organic emission layer and the second organic emission layer are disposed in at least one of the red sub-pixel region, the green sub-pixel region, and the blue sub-pixel region.

12. The organic light-emitting device of claim 11, wherein a difference between the maximum luminescence wavelength of the first dopant and the maximum luminescence wavelength of the second dopant is 10 nm or less.

13. The organic light-emitting device of claim 11, wherein the first organic emission layer further includes the second dopant, and
    a concentration of the second dopant in the first organic emission layer is smaller than a concentration of the first dopant in the first organic emission layer.

14. The organic light-emitting device of claim 13, wherein the concentration of the second dopant is 50% of the concentration of the first dopant or less.

15. The organic light-emitting device of claim 11, wherein the second organic emission layer further includes the first dopant, and
    a concentration of the first dopant in the second organic emission layer is smaller than a concentration of the second dopant in the second organic emission layer.

16. The organic light-emitting device of claim 15, wherein the concentration of the first dopant is 50% of the concentration of the second dopant or less.

17. The organic light-emitting device of claim 11, wherein each of a doping concentration of the first dopant and a doping concentration of the second dopant ranges from 1% to 10%.

18. The organic light-emitting device of claim 17, wherein the doping concentration of the second dopant in the second organic emission layer is equal to or smaller than the doping concentration of the first dopant in the first organic emission layer.

19. The organic light-emitting device of claim 11, further comprising:
    a first charge generation layer and a second charge generation layer between the first organic emission layer and the second organic emission layer.

20. The organic light-emitting device of claim 11, wherein the second organic emission layer is disposed on the first organic emission layer.

* * * * *